US010217864B2

(12) United States Patent
Zang et al.

(10) Patent No.: US 10,217,864 B2
(45) Date of Patent: Feb. 26, 2019

(54) DOUBLE GATE VERTICAL FINFET SEMICONDUCTOR STRUCTURE

(71) Applicant: GLOBALFOUNDRIES Inc., Grand Cayman (KY)

(72) Inventors: Hui Zang, Guilderland, NY (US); Josef Watts, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 28 days.

(21) Appl. No.: 15/592,444

(22) Filed: May 11, 2017

(65) Prior Publication Data

US 2018/0331212 A1 Nov. 15, 2018

(51) Int. Cl.
*H01L 29/66* (2006.01)
*H01L 29/78* (2006.01)
*H01L 29/49* (2006.01)

(52) U.S. Cl.
CPC ...... *H01L 29/7827* (2013.01); *H01L 29/4966* (2013.01); *H01L 29/66666* (2013.01)

(58) Field of Classification Search
CPC ............. H01L 29/7827; H01L 29/4966; H01L 29/66666
USPC ........................................................ 257/329
See application file for complete search history.

(56) References Cited

U.S. PATENT DOCUMENTS

| 6,885,055 B2 | 4/2005 | Lee |
| 8,203,182 B2 | 6/2012 | Muller et al. |
| 9,190,466 B2 | 11/2015 | Basker et al. |

(Continued)

FOREIGN PATENT DOCUMENTS

CN 102832133 B 12/2014

*Primary Examiner* — Hrayr A Sayadian
(74) *Attorney, Agent, or Firm* — Thompson Hine LLP; Francois Pagette

(57) ABSTRACT

A semiconductor structure includes a substrate and a vertical FinFET disposed over the substrate. The vertical FinFET includes:
 a bottom source/drain (S/D) region disposed over the substrate,
 a fin extending vertically upwards from the bottom S/D region, the fin having a first ($1^{st}$) sidewall, a second ($2^{nd}$) sidewall and a top portion,
 an upper S/D region disposed over the top portion of the fin, the fin defining a channel between the bottom S/D region and the upper S/D region,
 a $1^{st}$ gate structure having a $1^{st}$ metal gate, the $1^{st}$ gate structure disposed on the $1^{st}$ sidewall of the fin, and
 a $2^{nd}$ gate structure having a $2^{nd}$ metal gate, the $2^{nd}$ gate structure disposed on the $2^{nd}$ sidewall of the fin.
The $1^{st}$ and $2^{nd}$ metal gates are electrically isolated from each other by the fin.

11 Claims, 18 Drawing Sheets

(56) References Cited

U.S. PATENT DOCUMENTS

2002/0011612 A1* 1/2002 Hieda ............. H01L 21/823814
 257/262
2012/0235234 A1 9/2012 Chang et al.

* cited by examiner

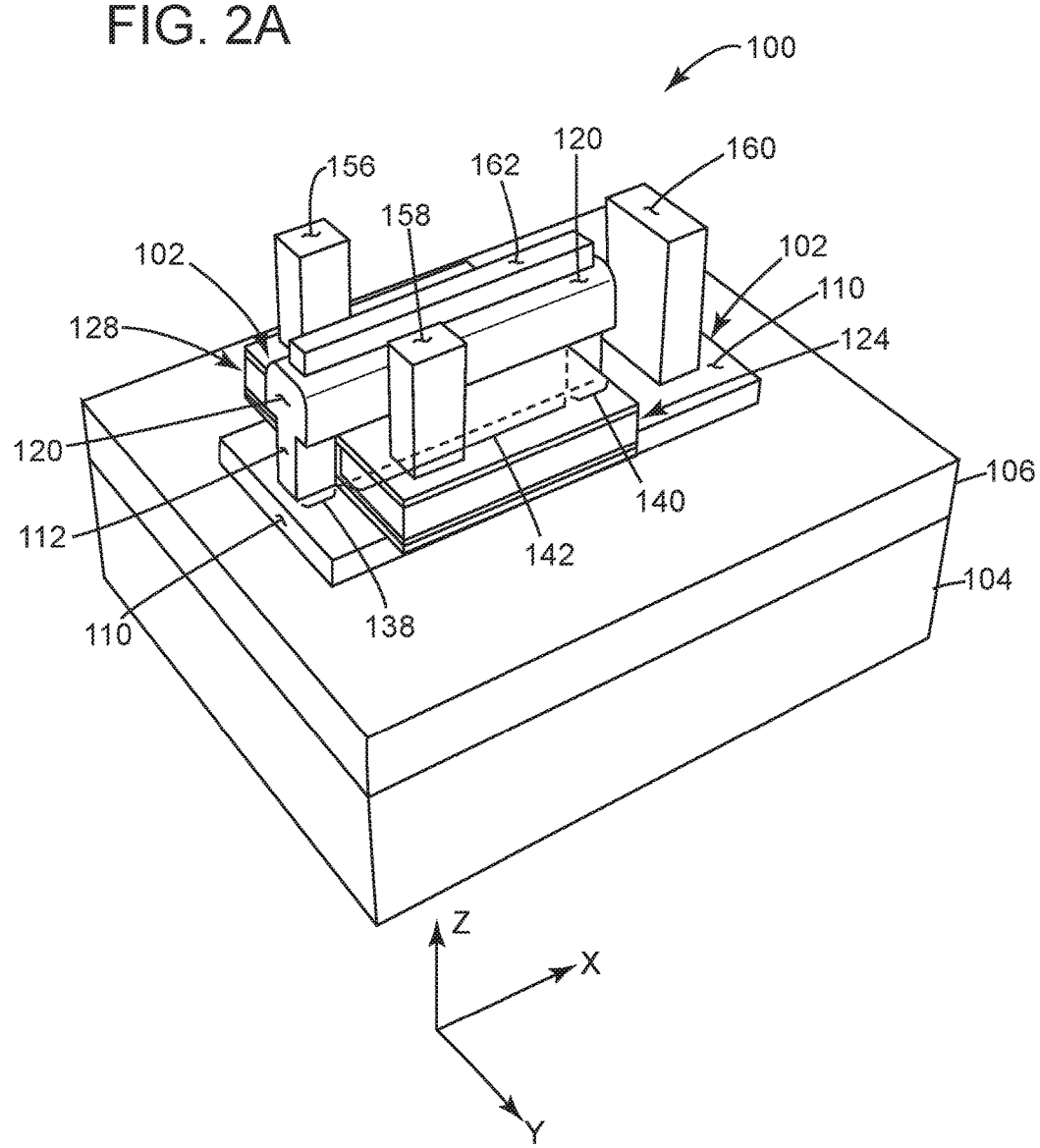

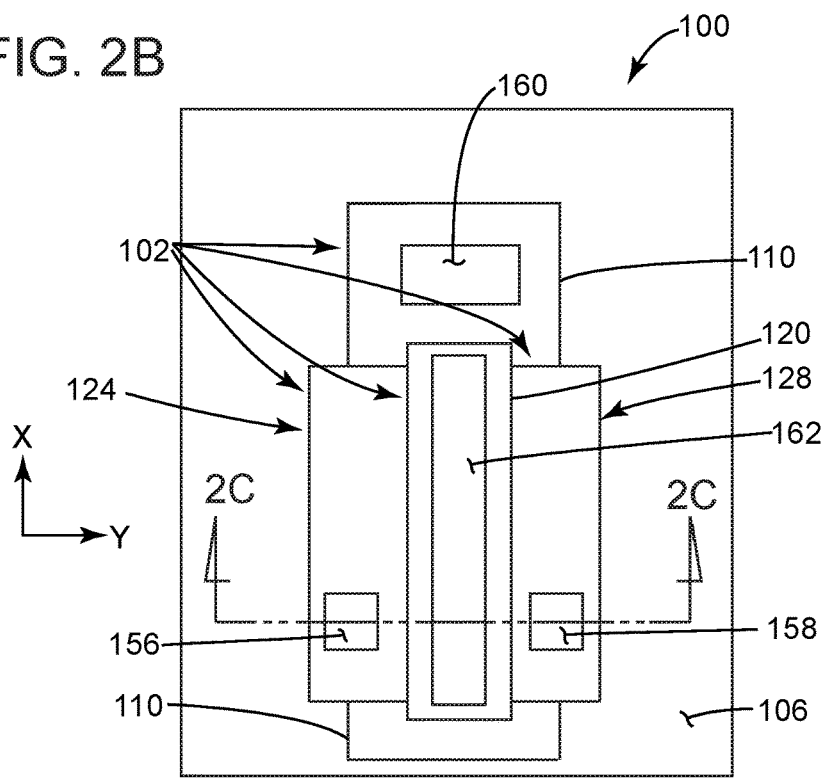
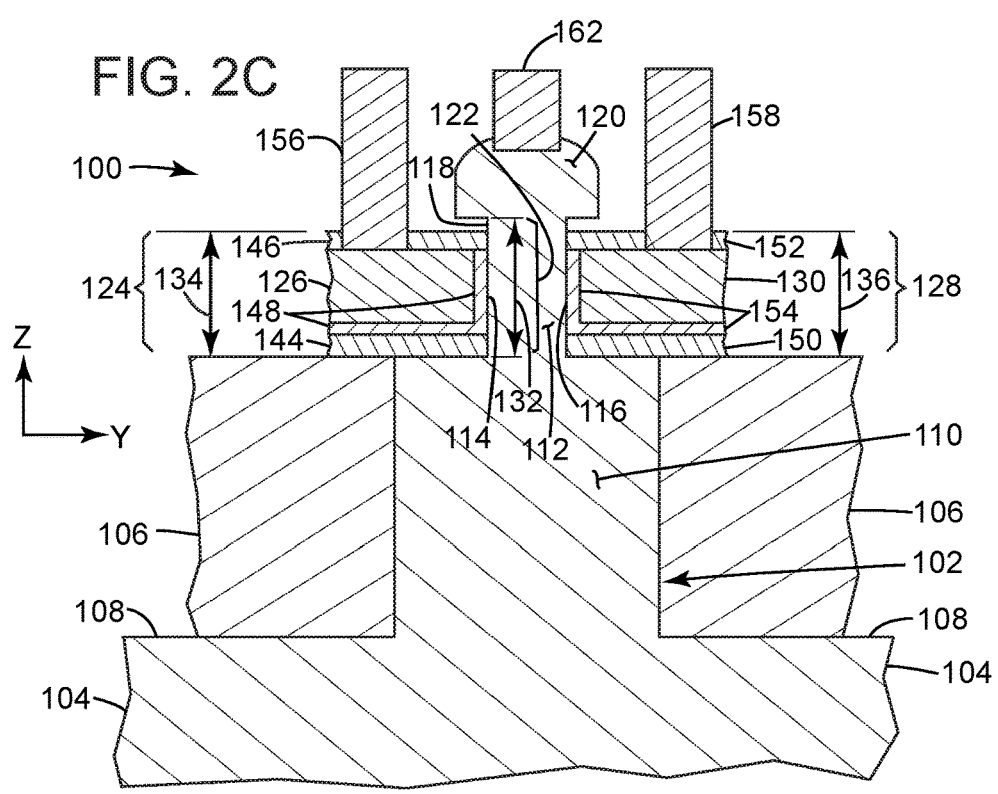

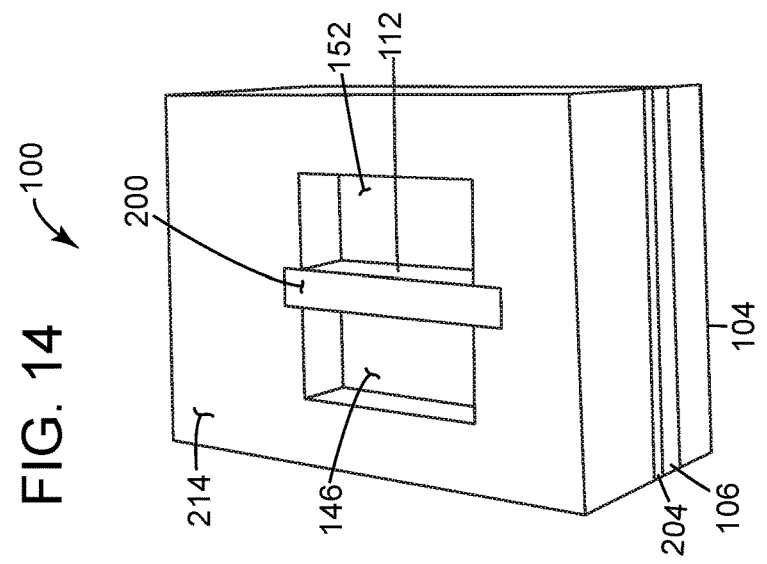
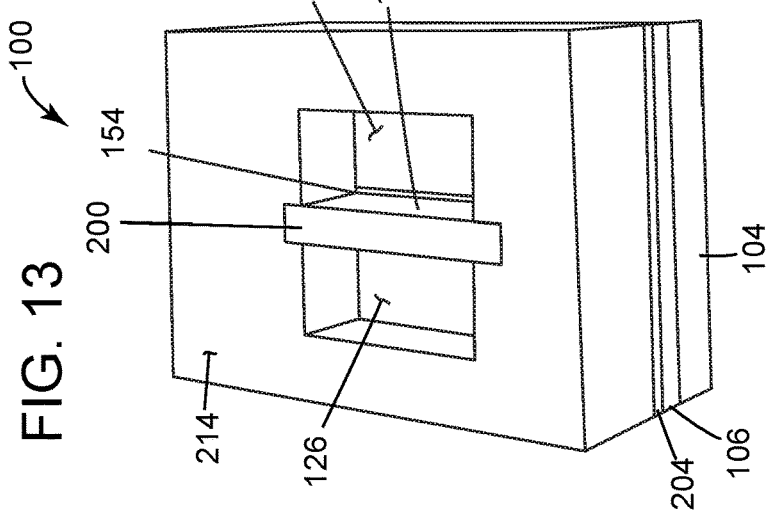
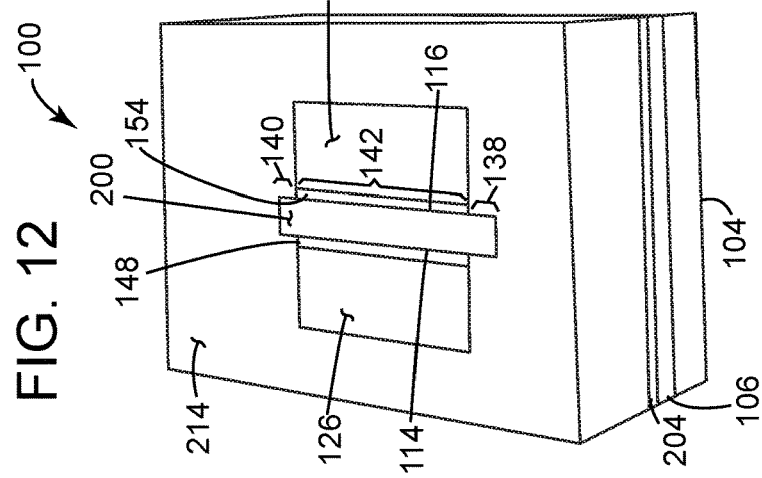

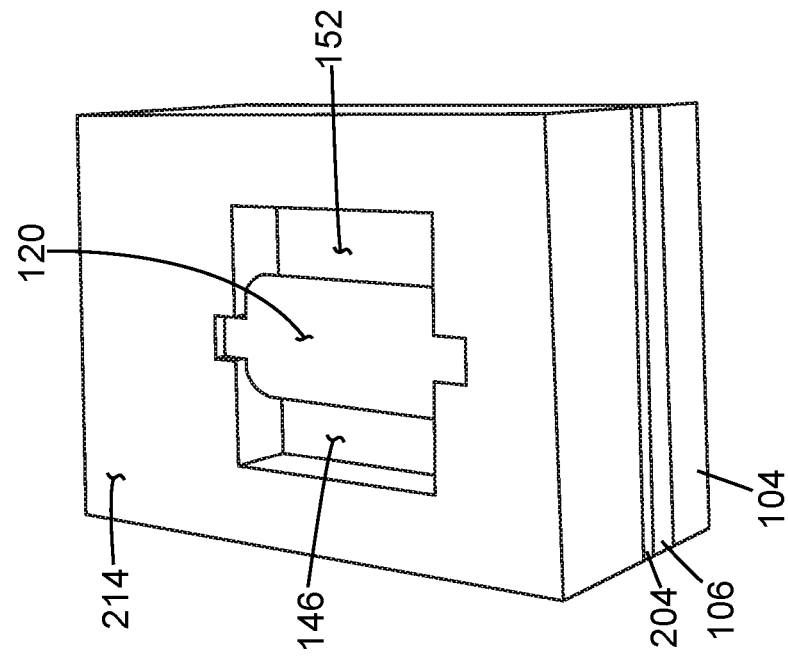
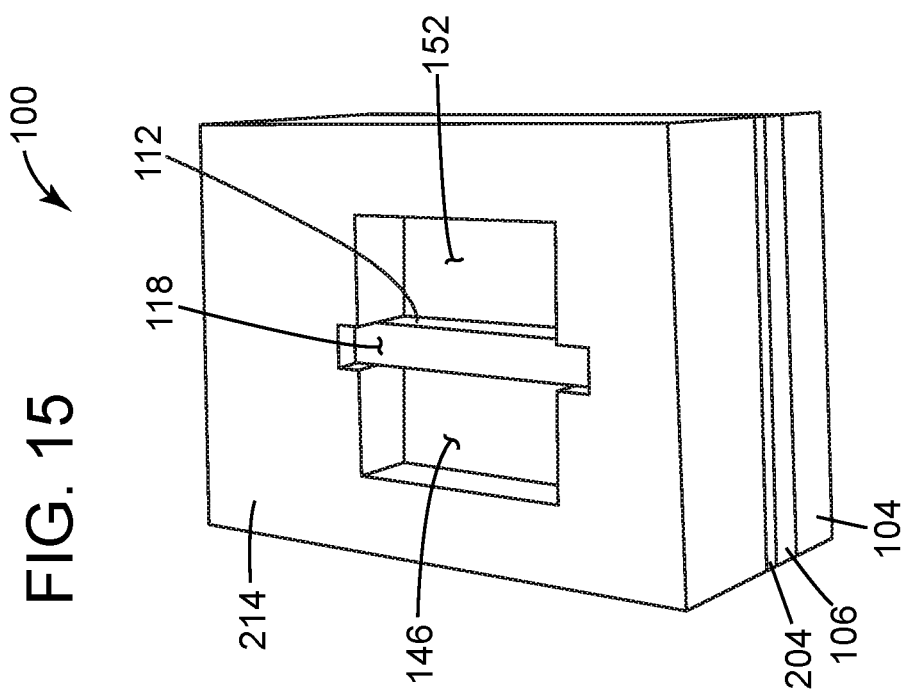

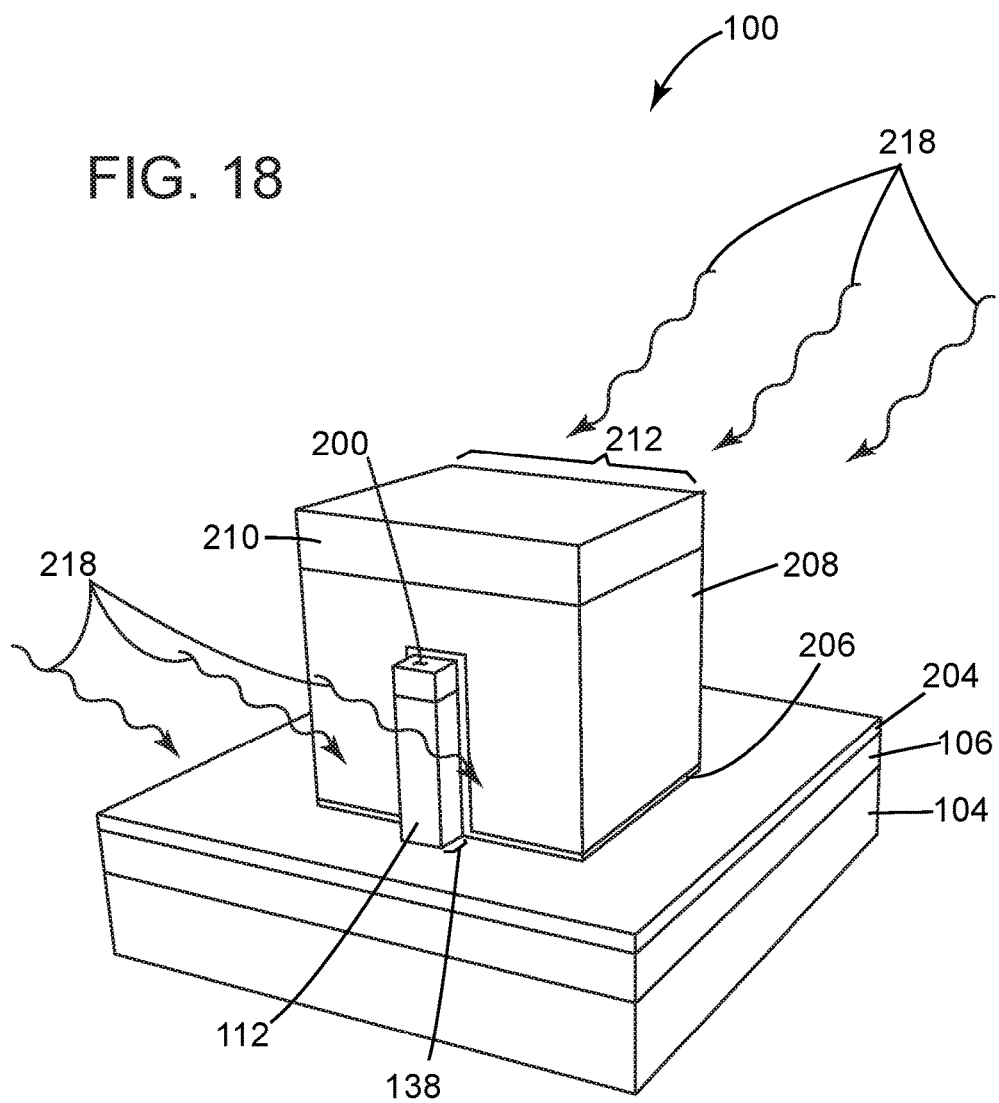

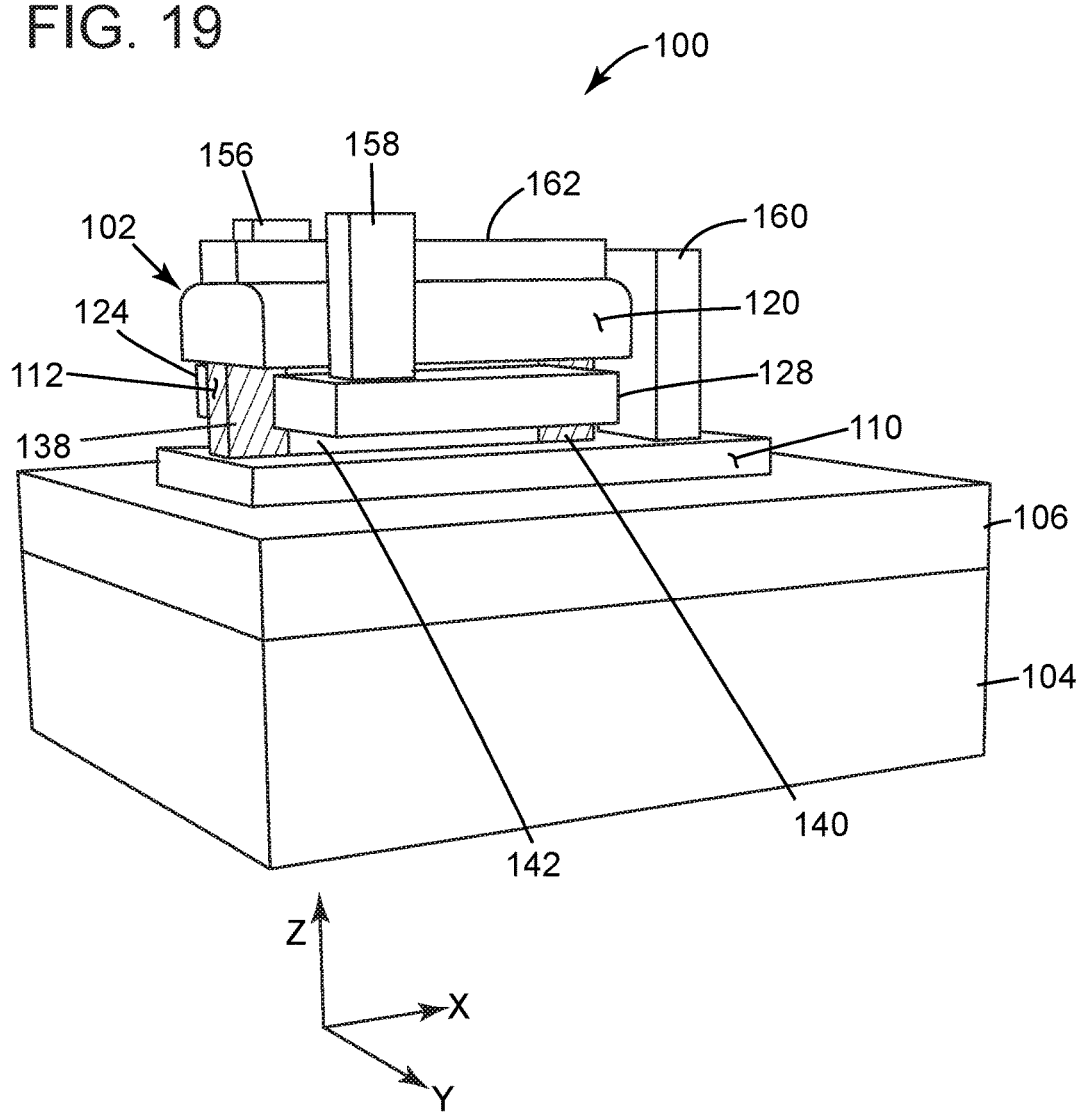

DOUBLE GATE VERTICAL FINFET SEMICONDUCTOR STRUCTURE

TECHNICAL FIELD

The present invention relates to semiconductor devices and methods of making the same. More specifically, the invention relates to semiconductor structures having vertical FinFETs, wherein the FinFETs have two independently controlled gates isolated by a fin of the vertical FinFETs.

BACKGROUND

Semiconductor structures are constantly being downsized to meet increasingly demanding requirements to the speed and functionality of ultra-high density integrated circuits. As such, Fin Field Effect Transistors (FinFETs) need to be ever more densely packaged within the substrate plane defined by the top surface of the silicone substrate in which the FinFETs are embedded within a semiconductor structure. However, such down-sizing provides technical challenges, which are difficult to solve. For example, leakage currents of FinFETs may increase as the channels within the FinFETs become smaller in length. Moreover, it is becoming ever more difficult to increase the overall area (or footprint) along the substrate plane of a semiconductor structure to accommodate larger numbers of FinFETs.

In addition to the need to downsize FinFETs in a semiconductor structure, there is also a growing demand for greater operational functionality. More specifically, there is a growing demand for dual speed operation of such FinFETs, wherein a FinFET can operate at one speed in one mode, and at another faster speed in another mode.

One class of semiconductor devices that would benefit from such dual speed FinFET operation would be Static Random Access Memory (SRAM) cells. SRAM is typically used in personal computers, workstations, routers, peripheral equipment and the like. SRAM cells are often composed of various pull-up and pull-down transistors connected together to form a pair of cross coupled inverters with opposing logic states. The inverters are connected to a pair of pass-gate transistors, which control the flow of data into and out of the SRAM cell during read and write operations.

It is well known that the stability of SRAM cells depends in large part on the speed of the pass-gate transistors relative to the speed of the pull-up and pull-down transistors. It is also well known that for optimum stability, the speed of the pass-gate transistors should be one speed during a read operation and another faster speed during a write operation of the SRAM cell. Such dual speed operating modes can be accomplished with multiple pass-gate transistors connected in parallel, but would also increase cost, complexity and size of each SRAM cell.

Accordingly, there is a need for a FinFET that has a smaller overall footprint for denser packaging. Additionally, there is a need for such a FinFET to have dual speed operating modes for added functionality.

BRIEF DESCRIPTION

The present invention offers advantages and alternatives over the prior art by providing a semiconductor structure having a vertical FinFET. The vertical FinFET has two independently operated gates that are separated and electrically isolated from each other by a fin of the FinFET. The vertical FinFET reduces that overall footprint along the substrate plane of a semiconductor structure compared to that of the prior art. Additionally, the independently operated gates enable at least two speed operation of the FinFET.

A semiconductor structure in accordance with one or more aspects of the present invention includes a substrate and a vertical FinFET disposed over the substrate. The vertical FinFET includes:

a bottom source/drain (S/D) region disposed over the substrate, a fin extending vertically upwards from the bottom S/D region, the fin having a first ($1^{st}$) sidewall, a second ($2^{nd}$) sidewall and a top portion, an upper S/D region disposed over the top portion of the fin, the fin defining a channel between the bottom S/D region and the upper S/D region, a $1^{st}$ gate structure having a $1^{st}$ metal gate, the $1^{st}$ gate structure disposed on the $1^{st}$ sidewall of the fin, and a $2^{nd}$ gate structure having a $2^{nd}$ metal gate, the $2^{nd}$ gate structure disposed on the $2^{nd}$ sidewall of the fin.

The $1^{st}$ and $2^{nd}$ metal gates are electrically isolated from each other by the fin.

A method in accordance with one or more aspects of the present invention includes forming a bottom S/D region disposed over a substrate and a fin extending vertically upwards from a top surface of the bottom S/D region. A lower spacer layer is disposed over the bottom S/D region. A high-k dielectric layer is disposed over the lower spacer layer and the fin. A gate metal layer is disposed over the high-k dielectric layer. The gate metal layer is etched to expose $1^{st}$ and $2^{nd}$ fin end portions of the fin and to leave the gate metal layer disposed over a fin intermediate portion of the fin. The gate metal layer is polished to form $1^{st}$ and $2^{nd}$ metal gates disposed on opposing sidewalls of the fin and electrically isolated by the fin. The $1^{st}$ and $2^{nd}$ metal gates are recessed below a top portion of the fin. A $1^{st}$ upper spacer is disposed over the $1^{st}$ metal gate and a $2^{nd}$ upper spacer is disposed over the $2^{nd}$ metal gate. An upper S/D region is epitaxially grown over the top portion of the fin.

DRAWINGS

The invention will be more fully understood from the following detailed description taken in conjunction with the accompanying drawings, in which:

FIG. 2A is a perspective view of an exemplary embodiment of a semiconductor structure having a double gate vertical FinFET disposed over a substrate in accordance with the present invention;

FIG. 2B is a top view of the structure of FIG. 2A;

FIG. 2C is a side view of the structure of FIG. 2B taken along the line 2C-2C of FIG. 2B;

FIG. 12 is a perspective view of an exemplary embodiment of the structure of FIG. 11 having another FOX layer disposed over the structure and the gate metal layer planarized down to the level of the hardmask layer to form a $1^{st}$ and a $2^{nd}$ metal gate separated by the fin in accordance with the present invention;

FIG. 13 is a perspective view of an exemplary embodiment of the structure of FIG. 12 having the $1^{st}$ and $2^{nd}$ metal gates recessed in accordance with the present invention;

FIG. 14 is a perspective view of an exemplary embodiment of the structure of FIG. 13 having a $1^{st}$ and a $2^{nd}$ upper spacer disposed over the $1^{st}$ and $2^{nd}$ metal gates respectively in accordance with the present invention;

FIG. 15 is a perspective view of an exemplary embodiment of the structure of FIG. 14 having the hardmask layer removed to expose a top portion of the fin in accordance with the present invention;

FIG. 16 is a perspective view of an exemplary embodiment of the structure of FIG. 15 having an upper S/D region formed over the top portion of the fin in accordance with the present invention;

Figure 17:
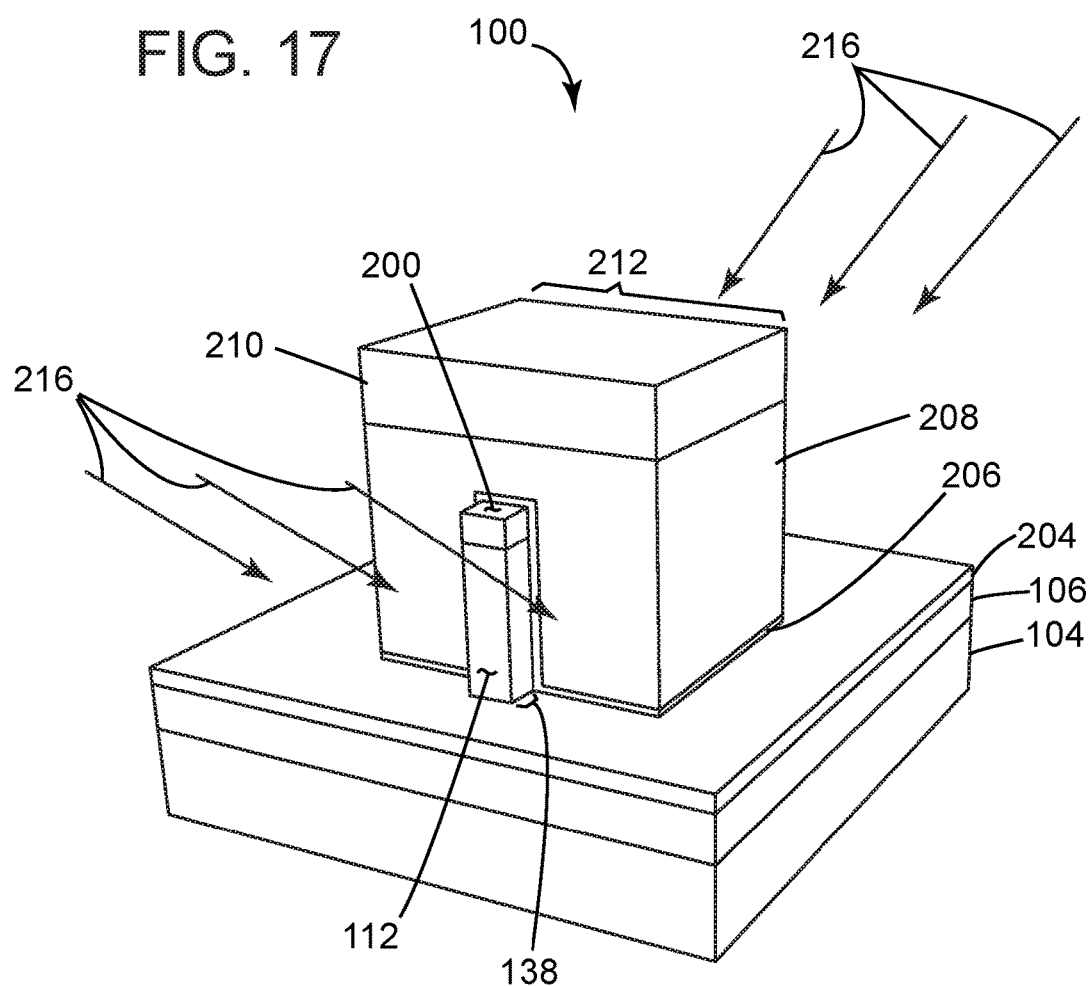
FIG. 17 is a perspective view of another exemplary embodiment of the structure of FIG. 2A at an intermediate stage of its process flow, wherein $1^{st}$ and $2^{nd}$ end portions of the fin are subjected to an ion implantation process in accordance with the present invention.

FIG. 18 is a perspective view of another exemplary embodiment of the structure of FIG. 2A at an intermediate stage of its process flow, wherein $1^{st}$ and $2^{nd}$ end portions of the fin are subjected to a thermal oxidation process in accordance with the present invention; and FIG. 19 is a perspective view of the structures of FIG. 17 and FIG. 18 at an end stage of their process flows, wherein the $1^{st}$ and $2^{nd}$ end portions of the fin are either implanted with a dopant concentration as a result of the ion implantation process of FIG. 17 or are formed of silicone dioxide as a result of the thermal oxidation process of FIG. 18 in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1A:
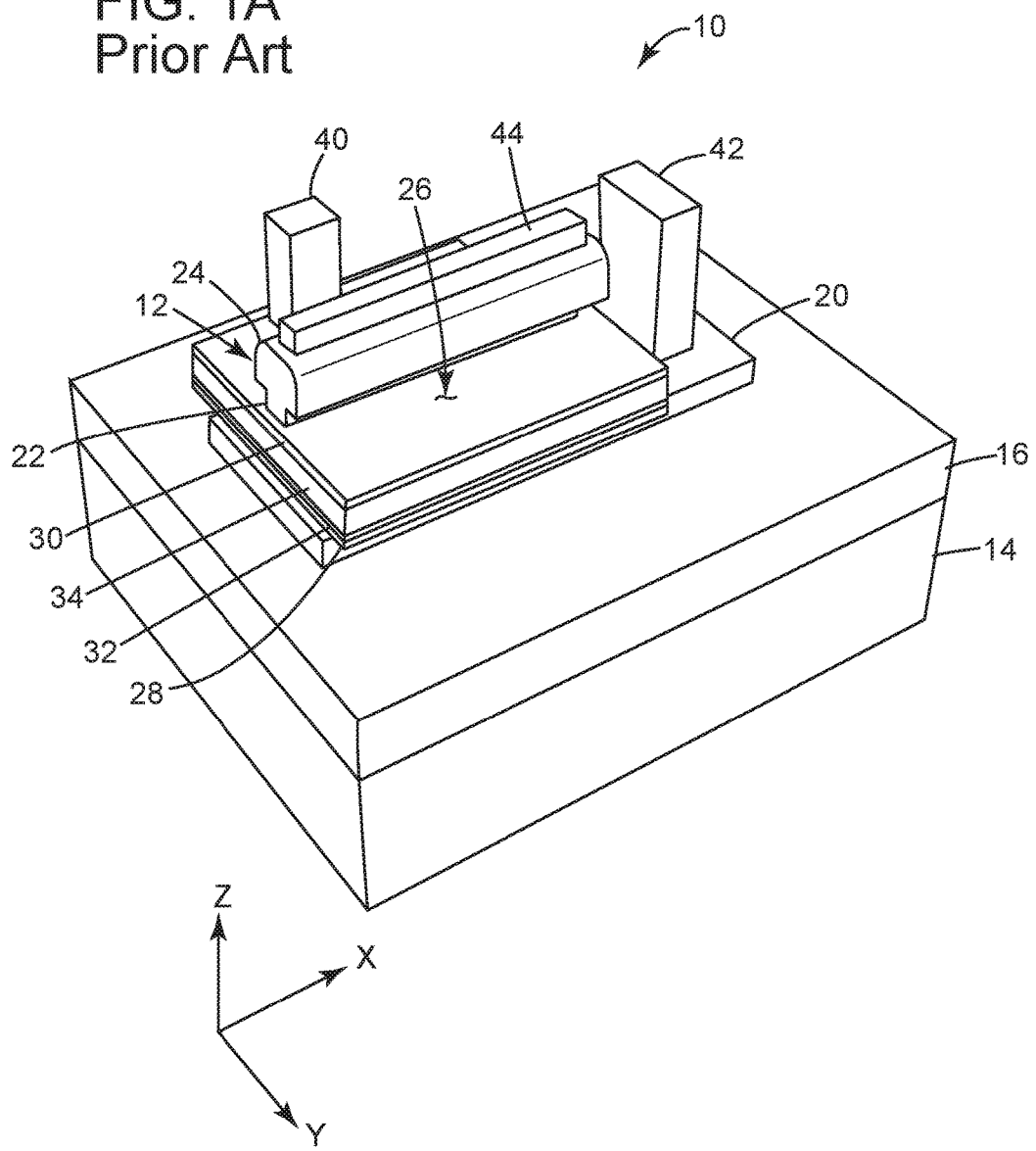
FIG. 1A is a perspective view of a prior art exemplary embodiment of a semiconductor structure having a vertical Fin Field Effect Transistor (FinFET) disposed over a substrate.
Figure 1B:
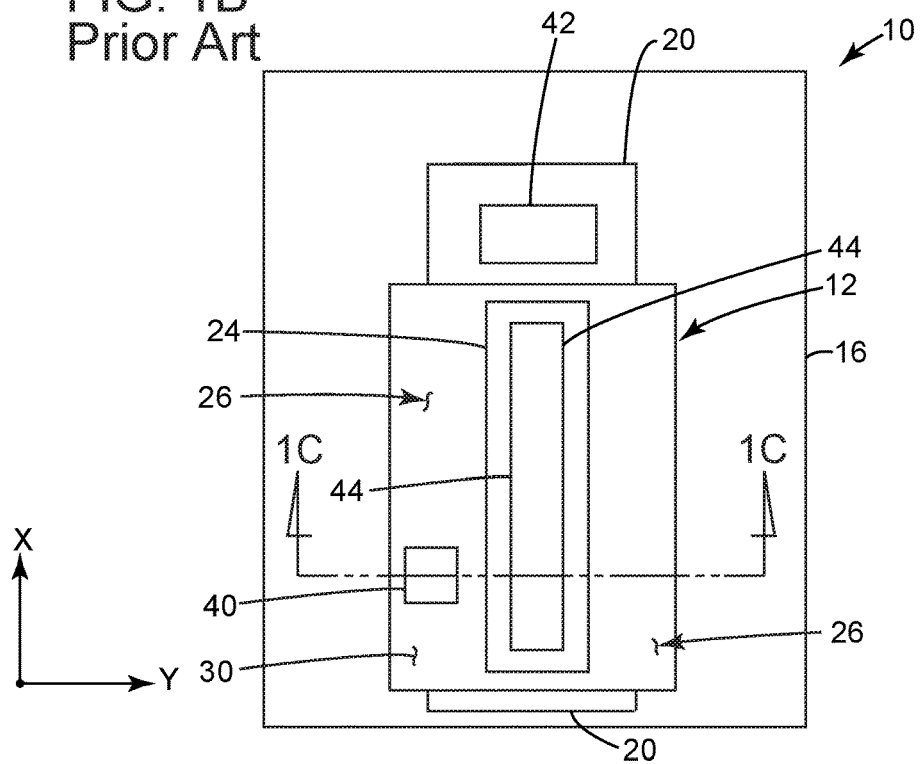
FIG. 1B is a top view of the structure of FIG. 1A.
Figure 1C:
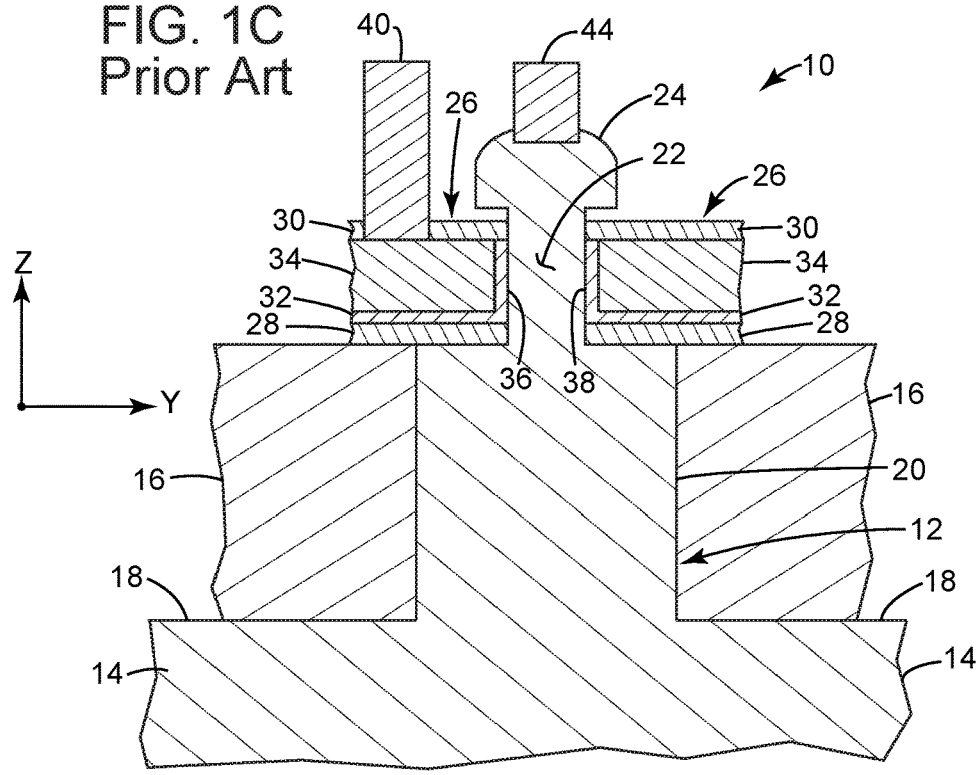
FIG. 1C is a side view of the structure of FIG. 1B taken along the line 1C-1C of FIG. 1B.

FIGS. 1A-1C illustrate an exemplary embodiment of a prior art vertical FinFET. FIGS. 2A-2C illustrate an exemplary embodiment of a double gate vertical FinFET in accordance with the present invention. FIGS. 3-18 illustrate a method of making the double gate vertical FinFET in accordance with the present invention.

Referring to FIGS. 1A, 1B and 1C, wherein:
 FIG. 1A is a perspective view of a prior art exemplary embodiment of a semiconductor structure 10 having a vertical Fin Field Effect Transistor (FinFET) 12 disposed over a substrate 14;
 FIG. 1B is a top view of the structure 10; and
 FIG. 1C is a cross-sectional view of the structure 10 taken along the line 1C-1C of FIG. 1B.

Semiconductor structure 10 includes a FinFET 12 disposed over the bulk substrate 14. A flowable oxide (FOX) layer 16 is disposed over a top surface 18 of the bulk substrate 14. The FOX layer 16 surrounds a bottom source/drain (S/D) region 20 of the FinFET 12, which extends vertically upwards and longitudinally across the top surface 18 of the substrate 14. In addition to the bottom S/D region 20, the FinFET 12 includes a fin 22 extending vertically upwards and longitudinally across the bottom S/D region 20. An upper S/D region 24 disposed over a top end portion of the fin 22. The FinFET 12 also includes a single gate structure 26, which completely surrounds the perimeter of fin 22.

For purposes herein, the top surface 18 of the bulk substrate 14 defines a substrate plane, wherein the longitudinal direction of the fin 22 disposed over the top surface 18 will be considered the X direction of the substrate plane and the direction perpendicular to the X direction will be considered the Y direction of the substrate plane. Additionally, the direction perpendicular to the substrate plane will be considered the vertical, or Z direction.

The gate structure 26 includes a lower gate spacer 28, an upper gate spacer 30, a high-k dielectric 32 and a metal gate 34. The lower and upper gate spacers 28, 30 may be composed of a dielectric material such as SiN, SiNC, SiBCN or similar. The high-k dielectric may be composed of such material as hafnium dioxide ($HfO_2$), nitride hafnium silicates (HfSiON) or the like. The metal gate can be a metal stack of a work-function metal (which can be TiN, TaN, TiCAl, other metal-nitrides or similar materials) and a gate electrode metal (which may be Al, W, Cu or similar metal). The lower and upper gate spacers 28, 30 are used to insulate the metal gate 34 from the bottom and upper S/D regions 20, 24 respectively. The gate dielectric is used to electrically insulate the metal gate 34 from the fin 22. The work-function metal of the metal gate 34 provides the work-function needed for proper FinFET operation, but typically has 10 to 100 times larger resistivity than the gate electrode metal. The gate electrode metal of the metal gate 34 typically has a very low resistivity.

Because the single gate structure 26 completely surrounds the fin 22, the singe gate structure 26 is disposed against both opposing sidewalls 36 and 38 of fin 22. As such, there is electrical conductivity between the regions of the metal gate 34 that are disposed on the opposing sidewalls 36 and 38. Therefore, only one CB (gate) contact 40 is needed to operate the entire gate structure. Additionally, however, there is only one mode of operation of the FinFET 12. That is, the FinFET 12 has only one operating speed and current that can be induced by the single gate structure 26.

Extending upwards in the vertical direction from the bottom S/D region 20 is a $1^{st}$ trench silicide (TS) contact 42. Extending upwards in the vertical direction from the upper S/D region 24 is a $2^{nd}$ TS contact 44. The TS contacts 42, 44 provide electrical conductivity between the S/D regions 20, 24 and active interconnect lines (not shown) used to operate the FinFET 12.

Referring to FIGS. 2A, 2B, and 2C, wherein:

FIG. 2A is a perspective view of an exemplary embodiment of a semiconductor structure 100 having a double gate vertical FinFET 102 disposed over a substrate 104 in accordance with the present invention;

FIG. 2B is a top view of the structure 100; and

FIG. 2C is a side view of the structure 100 taken along the line 2C-2C of FIG. 2B. Semiconductor structure 100 includes a double gate vertical FinFET 102 disposed over a substrate 104. A flowable oxide (FOX) layer 106 is disposed over a top surface 108 of the bulk substrate 104. The FOX layer 106 surrounds a bottom source/drain (S/D) region 110 of the FinFET 102.

In addition to the bottom S/D region 110, the FinFET 102 includes a fin 112 extending vertically upwards from the bottom S/D region 110. The fin 112 has a first ($1^{st}$) sidewall 114, a second ($2^{nd}$) sidewall 116 and a top portion 118. An upper S/D region 120 of FinFET 102 is disposed over the top portion 118 of the fin 112. The upper S/D region may be epitaxially grown. The fin defines a channel 122 between the bottom S/D region 110 and the upper S/D region 120.

The FinFET 102 also includes a $1^{st}$ gate structure 124 having a $1^{st}$ metal gate 126, wherein the $1^{st}$ gate structure 124 is disposed on the $1^{st}$ sidewall 114 of the fin 112. The FinFET 102 also includes a $2^{nd}$ gate structure 128 having a $2^{nd}$ metal gate 130, wherein the $2^{nd}$ gate structure 128 is disposed on the $2^{nd}$ sidewall 116 of the fin 112.

The $1^{st}$ and $2^{nd}$ metal gates 126, 130 are electrically isolated from each other by the fin 112. More specifically, there is no electrically conductive path between the $1^{st}$ and $2^{nd}$ metal gates 126, 130 that is not interrupted by a dielectric layer. As such, the $1^{st}$ gate structure 124 is operable to modulate the conduction of charged carriers through the channel 122. Additionally the $2^{nd}$ gate structure 128 is also operable to modulate the conduction of charged carriers through the channel 122. Moreover, the $1^{st}$ and $2^{nd}$ gate structures 124, 128 are operable independently of each other and the channel conduction is determined by the potential on both gates.

The fin 112 extends vertically upwards from the bottom S/D region 110 to the upper S/D region 120 to define a fin height 132. In order to isolate the $1^{st}$ and $2^{nd}$ metal gates 126, 130, the fin height 132 is greater than or equal to a height 134 of the $1^{st}$ structure 124 and greater than or equal to a height 136 of the $2^{nd}$ gate structure 128.

The fin 112 also extends longitudinally along an upper surface of the bottom S/D region 110 to define a $1^{st}$ fin end portion 138 and a $2^{nd}$ fin end portion 140 with a fin intermediate portion 142 extending therebetween (best seen in FIG. 2A). The $1^{st}$ and $2^{nd}$ metal gates 126, 130, are disposed within the fin intermediate portion 142 of the fin 112 only, in order to isolate the $1^{st}$ and $2^{nd}$ metal gates 126, 130 from each other. That is, no portion of the $1^{st}$ and $2^{nd}$ metal gates 126, 130 (and in this embodiment, no portion of the $1^{st}$ and $2^{nd}$ metal gate structures 124, 128) are disposed against the $1^{st}$ and $2^{nd}$ fin end portions 138, 140.

For purposes herein, the top surface 108 of the substrate 104 defines a substrate plane, wherein the longitudinal direction of the fin 112 disposed over the top surface 108 will be considered the X direction of the substrate plane and the direction perpendicular to the X direction will be considered the Y direction of the substrate plane. Additionally, the direction perpendicular to the substrate plane will be considered the vertical, or Z direction.

In addition to the $1^{st}$ metal gate 126, the $1^{st}$ gate structure 124 also includes a $1^{st}$ lower spacer 144, a $1^{st}$ upper spacer 146 and a $1^{st}$ high-k dielectric 148. The $1^{st}$ lower spacer 144 is disposed over the bottom S/D region 110. The $1^{st}$ metal gate 126 is disposed over the $1^{st}$ lower spacer 144. The $1^{st}$ upper spacer 146 is disposed over the $1^{st}$ metal gate 126. The $1^{st}$ high-k dielectric 148 is disposed between the $1^{st}$ metal gate 126 and the fin 112. Additionally, in this embodiment, the $1^{st}$ high-k dielectric 148 is disposed between the $1^{st}$ metal gate 126 and the $1^{st}$ lower spacer 144.

In addition to the $2^{nd}$ metal gate 130, the $2^{nd}$ gate structure 128 also includes a $2^{nd}$ lower spacer 150, a $2^{nd}$ upper spacer 152 and a $2^{nd}$ high-k dielectric 154. The $2^{nd}$ lower spacer 150 is disposed over the bottom S/D region 110. The $2^{nd}$ metal gate 130 is disposed over the $2^{nd}$ lower spacer 150. The $2^{nd}$ upper spacer 152 is disposed over the $2^{nd}$ metal gate 130. The $2^{nd}$ high-k dielectric 154 is disposed between the $2^{nd}$ metal gate 130 and the fin 112. Additionally, in this embodiment, the $2^{nd}$ high-k dielectric 154 is disposed between the $2^{nd}$ metal gate 130 and the $2^{nd}$ lower spacer 150.

The $1^{st}$ and $2^{nd}$ lower gate spacers 144, 150, as well as the $1^{st}$ and $2^{nd}$ upper gate spacers 146, 152 may be composed of a dielectric material such as SiN, SiNC, SiBCN or similar. The $1^{st}$ and $2^{nd}$ high-k dielectrics 148, 154 may be composed of such material as hafnium dioxide (HfO2), nitride hafnium silicates (HfSiON) or the like. The $1^{st}$ and $2^{nd}$ metal gates 126, 130 can be a metal stack of a work-function metal (which can be TiN, TaN, TiCAl, other metal-nitrides or similar materials) and a gate electrode metal (which may be Al, W, Cu or similar metal). The lower and upper gate spacers 144, 146, 150, 152 are used to insulate the metal gates 126, 130 from the bottom and upper S/D regions 110, 120 respectively. The $1^{st}$ and $2^{nd}$ high-k dielectrics 148, 154 are used to electrically insulate the metal gates 126, 130 from the fin 112. The work-function metal of the metal gates 126, 130 provides the work-function needed for proper FinFET operation, but typically has 10 to 100 times larger resistivity than the gate electrode metal. The gate electrode metal of the metal gates 126, 130 typically has a very low resistivity. In this exemplary embodiment, the fin 112 electrically isolates the $1^{st}$ and $2^{nd}$ gate structures 124, 128.

The semiconductor structure 100 also includes a $1^{st}$ CB contact 156 in electrical contact with the $1^{st}$ metal gate 126, wherein the $1^{st}$ CB contact 156 is operable to activate the $1^{st}$ metal gate 126. Additionally, structure 100 includes a $2^{nd}$ CB contact 158 in electrical contact with the $2^{nd}$ metal gate 130, wherein the $2^{nd}$ CB contact 158 is operable to activate the $2^{nd}$ metal gate 130. Moreover, the $1^{st}$ and $2^{nd}$ CB contacts 156, 158 are operable to activate their associated $1^{st}$ and $2^{nd}$ metal gates 126, 130 independently of each other.

The $1^{st}$ and $2^{nd}$ CB contacts 156, 158 may be composed of the same or similar materials as that of the gate electrode metal of the 1$^{st}$ and 2$^{nd}$ metal gates 126, 130. Therefore, the 1$^{st}$ and 2$^{nd}$ CB contacts 156, 158 may be composed of Al, W, Cu or similar metals.

Extending upwards in the vertical direction from the bottom S/D region 110 is a 1$^{st}$ trench silicide (TS) contact 160. Extending upwards in the vertical direction from the upper S/D region 120 is a 2$^{nd}$ TS contact 162. The TS contacts 160, 162 provide electrical conductivity between the S/D regions 110, 120 and active interconnect lines (not shown) used to operate the FinFET 102.

Referring to FIGS. 3-18, an exemplary embodiment of a method of making the semiconductor structure 100 having the double gate vertical FinFET 102 in accordance with the present invention is illustrated.

Figure 3:
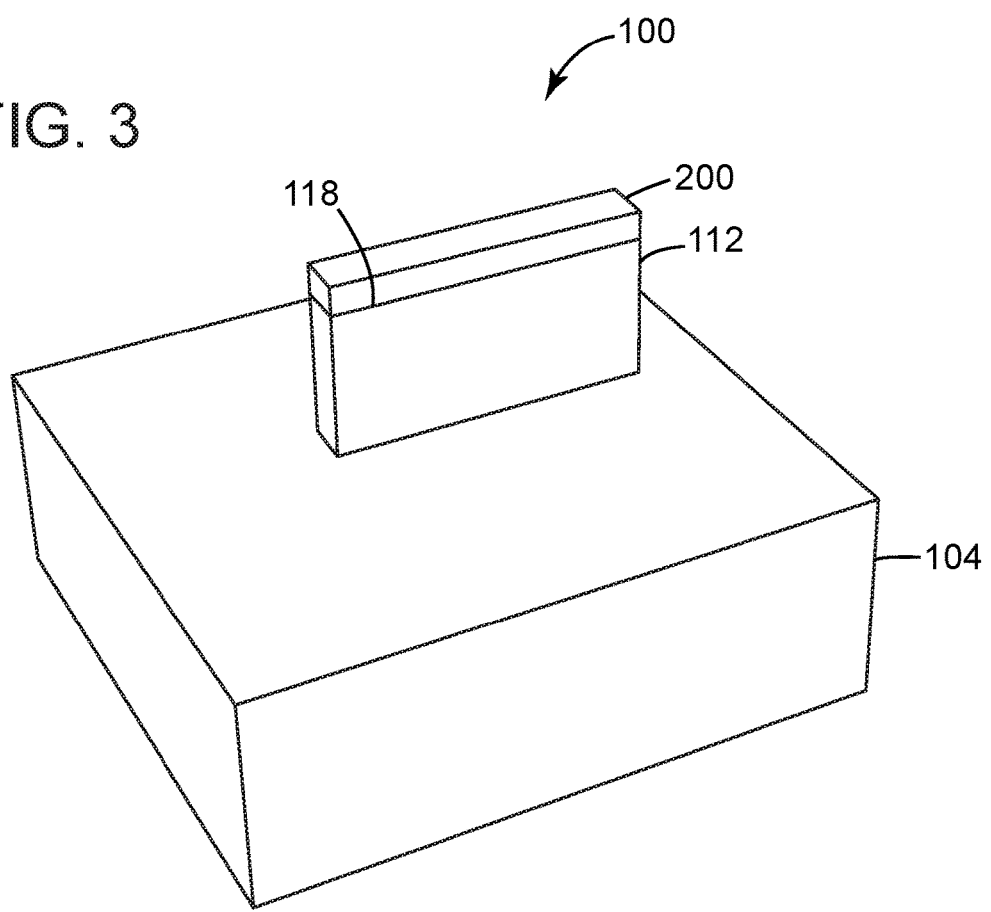
FIG. 3 is a perspective view of an exemplary embodiment of the structure of FIG. 2A at an intermediate stage of its process flow in accordance with the present invention.

Referring more specifically to FIG. 3, a hardmask layer 200 is first disposed over the substrate 104 of structure 100. The hardmask layer 200 may be composed of such material as silicon nitride (SNi) or similar. The hardmask layer 200 may be disposed by physical vapor deposition (PVD), chemical vapor deposition (CVD) or the like.

The hardmask layer 200 is then patterned and etched to form the fin 112 in the substrate 104. A portion of the hardmask layer 200 remains disposed over the top portion 118 of the fin 112 after the etching process.

Figure 4:
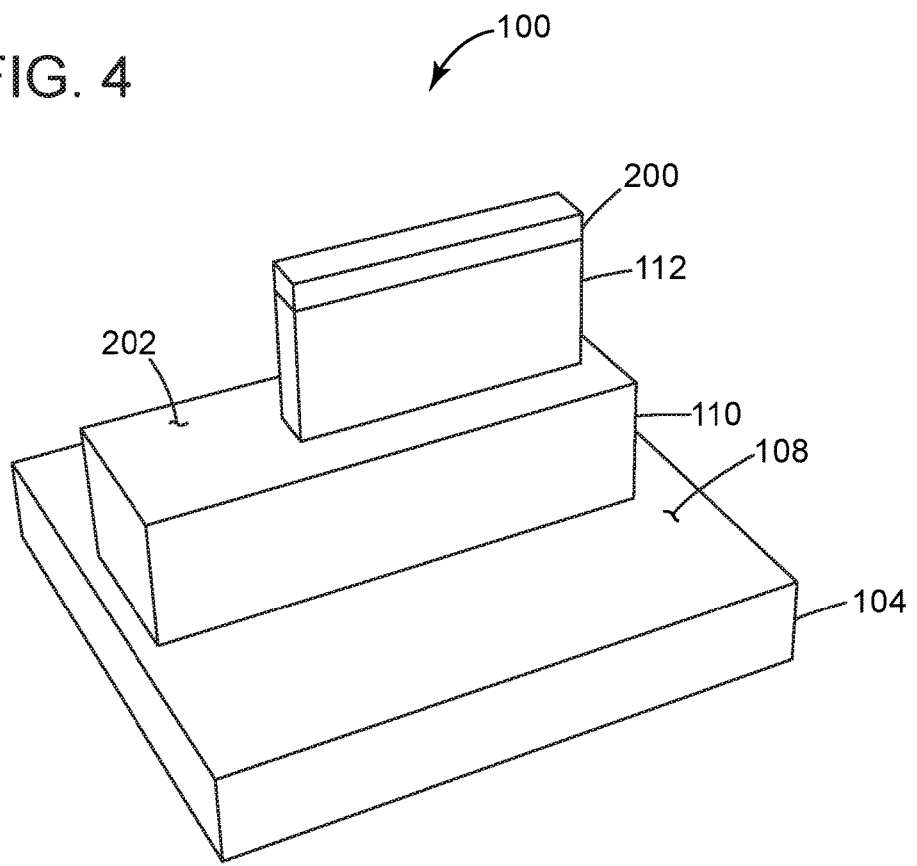
FIG. 4 is a perspective view of an exemplary embodiment of the structure of FIG. 3 having a bottom source/drain (S/D) region disposed over a substrate, a fin disposed over the bottom S/D region and a hardmask layer disposed over the fin in accordance with the present invention.

Referring to FIG. 4, a portion of the substrate 104, which surrounds the fin 112, is then patterned and etched to form the bottom S/D region 110 into the structure 100. The result at this stage of the process flow is that the bottom S/D region 110 is formed disposed over the substrate 104 and extending upwards (in the Z direction) from the top surface 108 of the bottom S/D region 110. Additionally, the fin 112 is formed extending upwards from a top surface 202 of the bottom S/D region 110. The fin 112 is also formed extending longitudinally across the S/D region 110.

Figure 5:
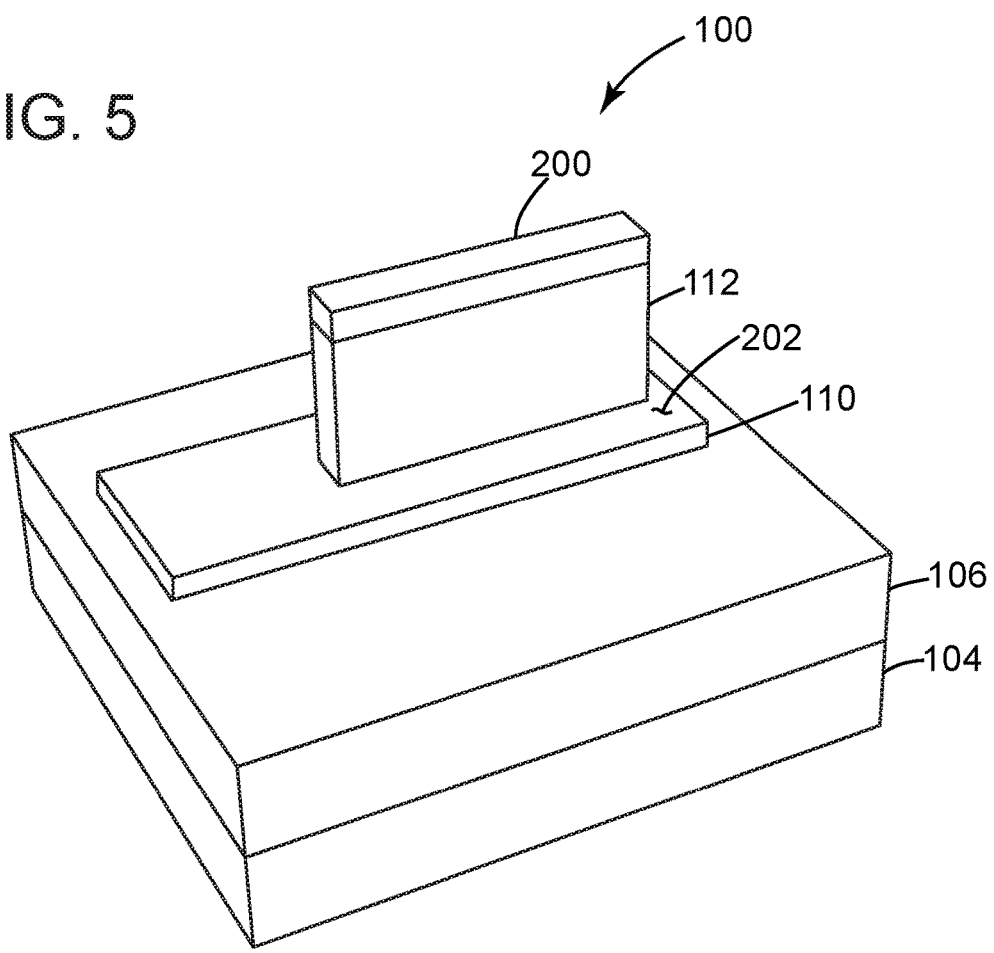
FIG. 5 is a perspective view of an exemplary embodiment of the structure of FIG. 4 having an FOX layer disposed over the substrate in accordance with the present invention.

Referring to FIG. 5, the flowable oxide layer (FOX) layer 106 is next disposed over the structure 100 such that the top surface 202 of the bottom S/D region 110 is not covered by the FOX layer 106. The FOX layer 106 may be disposed through CVD, PVD or other similar process.

Figure 6:
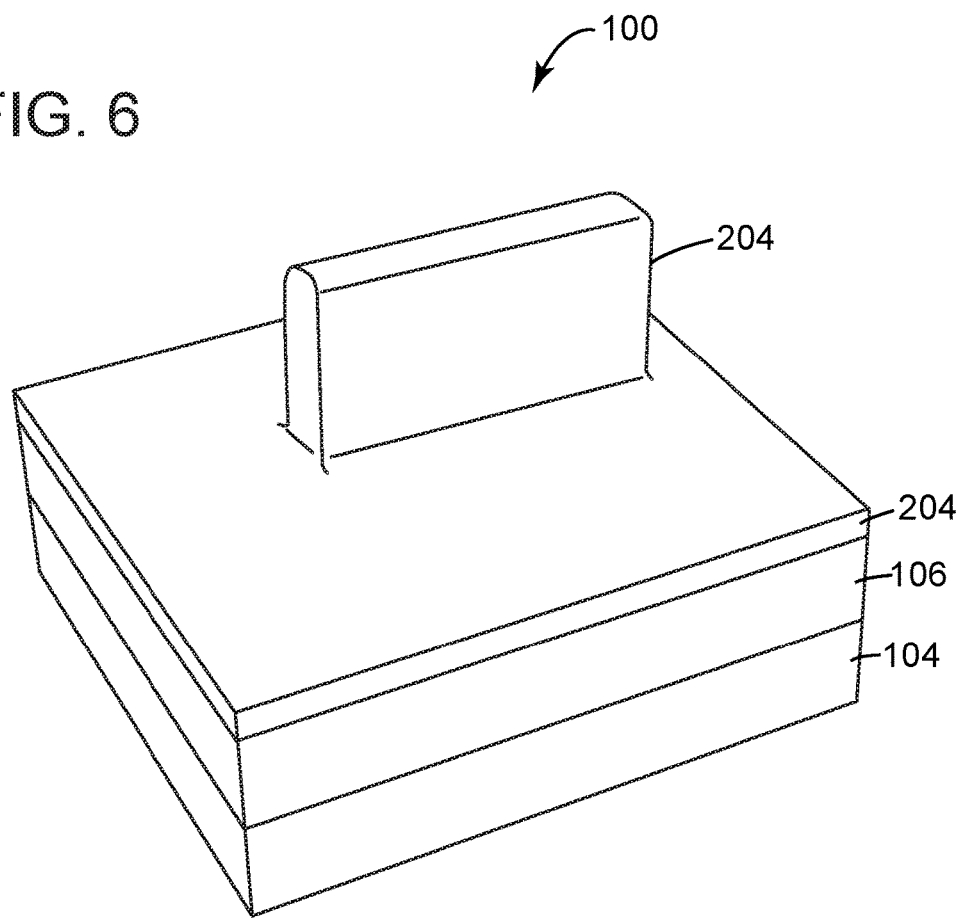
FIG. 6 is a perspective view of an exemplary embodiment of the structure of FIG. 5 having lower spacer layer disposed over the structure in accordance with the present invention.

Referring to FIG. 6, next a lower spacer layer 204 is disposed over the FOX layer 106, the top surface 202 of the bottom S/D region 110 and the fin 112. This may be done by a CVD, PVD, atomic layer deposition (ALD) or similar process.

The lower spacer layer 204 is composed of the same material as the 1$^{st}$ and 2$^{nd}$ lower spacers 144, 150. Accordingly, the lower spacer layer 204 may be composed of SiN, SiNC, SiBCN or similar.

Figure 7:
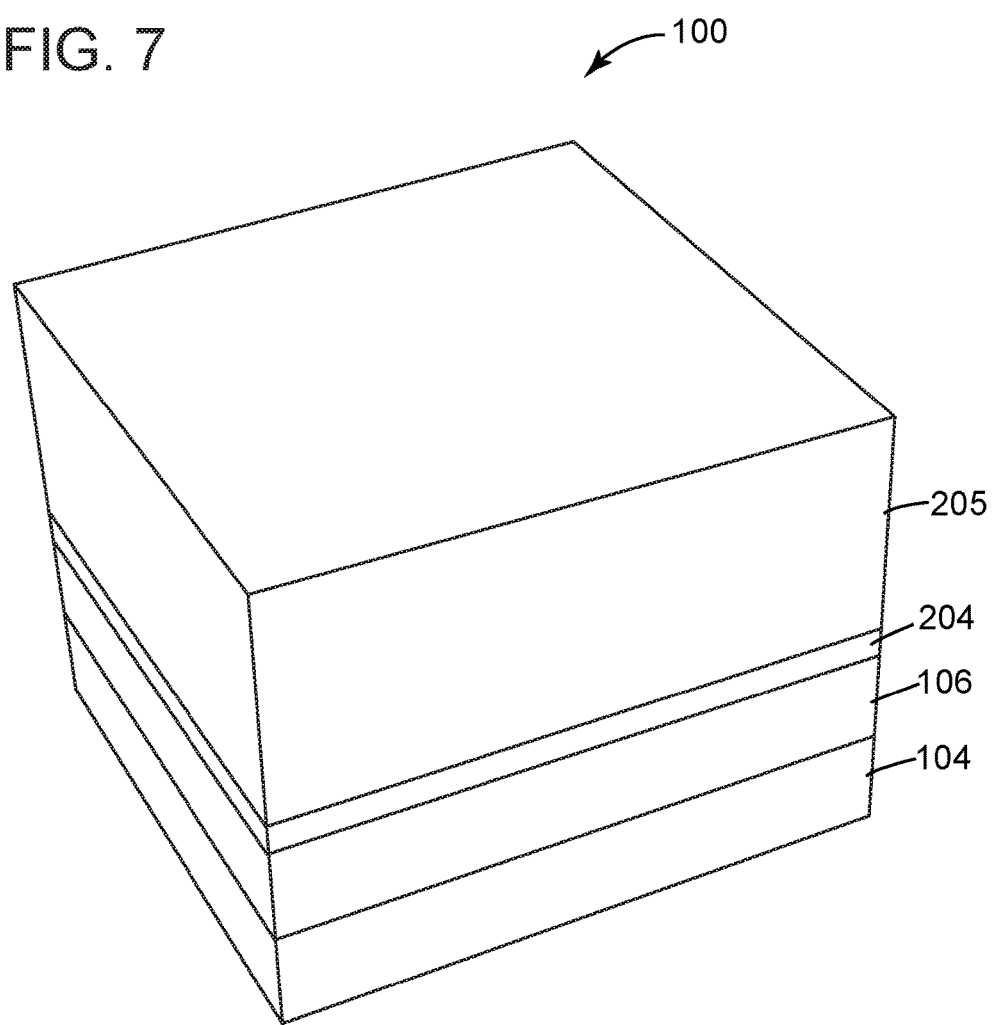
FIG. 7 is a perspective view of an exemplary embodiment of the structure of FIG. 6 having an OPL layer disposed over the structure in accordance with the present invention.

Referring to FIG. 7, at this stage of the process flow, the lower spacer layer 204 coats both sidewalls 114, 116 of the fin 112 and must be removed from those sidewalls. In order to accomplish this an organic planarization layer (OPL) 205 may be disposed over the entire structure 100 to completely cover the fin 112. The OPL (or OPL layer) 205 may be deposited using a spin-on deposition process. The OPL 205 may be composed of an organic material such as an amorphous carbon or other similar material.

Figure 8:
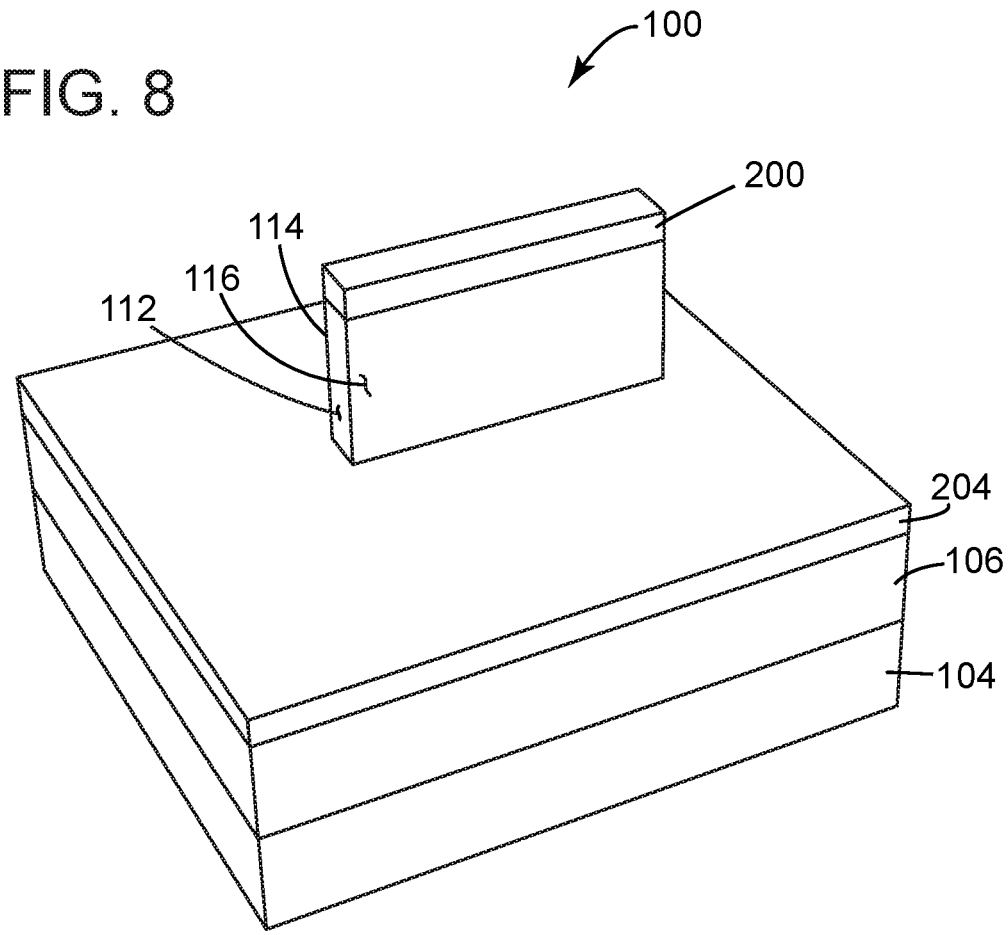
FIG. 8 is a perspective view of an exemplary embodiment of the structure of FIG. 7 having the OPL layer removed from the structure to expose the fin and lower spacer layer in accordance with the present invention.

Referring to FIG. 8, next the OPL 205 is etched away, along with the portion of the lower spacer layer 204 that is disposed on the fin 112. Accordingly, the fin 112 and a portion of the lower spacer layer 204 that is disposed over the FOX layer 106 are left exposed.

Figure 9:
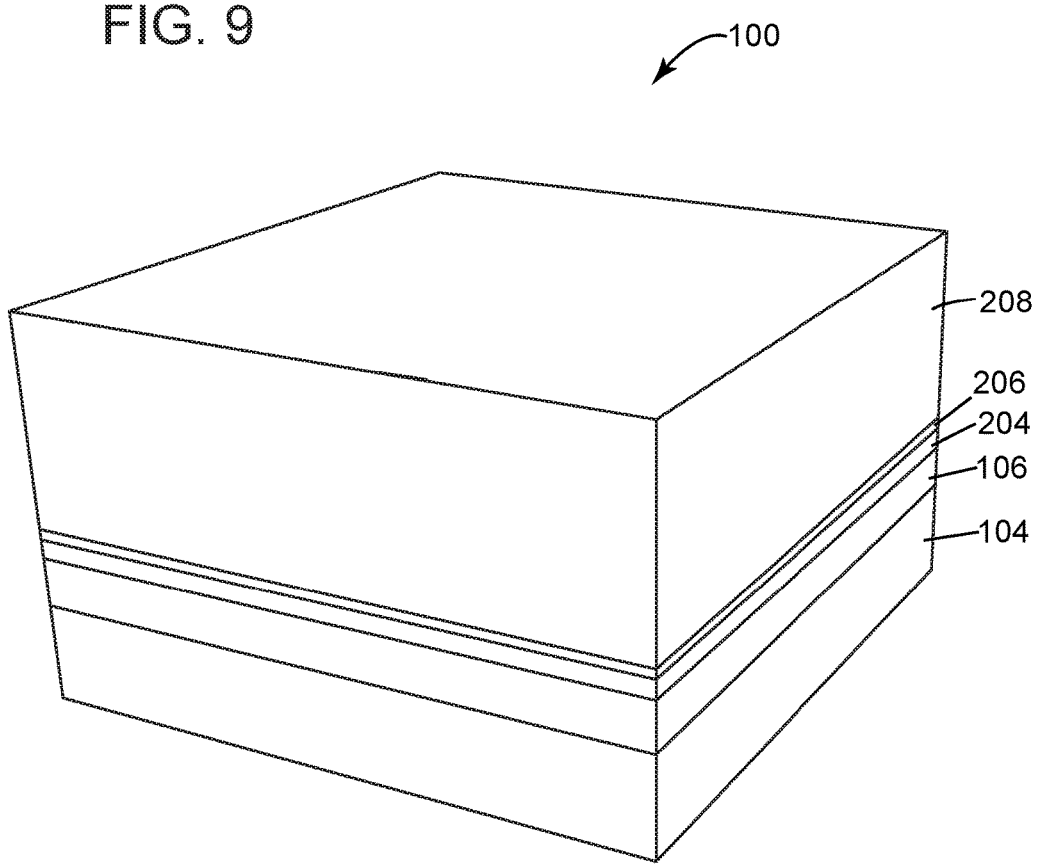
FIG. 9 is a perspective view of an exemplary embodiment of the structure of FIG. 8 having a high-k dielectric layer and gate metal layer disposed over the structure in accordance with the present invention.

Referring to FIG. 9, next in the process flow a high-k dielectric layer 206 is disposed over the lower spacer layer 204 and the fin 112. This may be done by an ALD process or similar.

The high-k dielectric layer 206 is composed of the same material as the 1$^{st}$ and 2$^{nd}$ high-k dielectrics 148, 154. Accordingly, the high-k dielectric layer 206 may be composed of such material as hafnium dioxide (HfO2), nitride hafnium silicates (HfSiON) or the like.

Next a gate metal layer 208 is disposed over the high-k dielectric layer 206. This may be done by CVD, PVD, electroplating or other similar process.

The gate metal layer 208 is composed of the same materials as the 1$^{st}$ and 2$^{nd}$ metal gates 126, 130. As such, the gate metal layer 208 may be a metal stack of a work-function metal (which can be TiN, TaN, TiCAl, other metal-nitrides or similar materials) and a gate electrode metal (which may be Al, W, Cu or similar metal).

Figure 10:
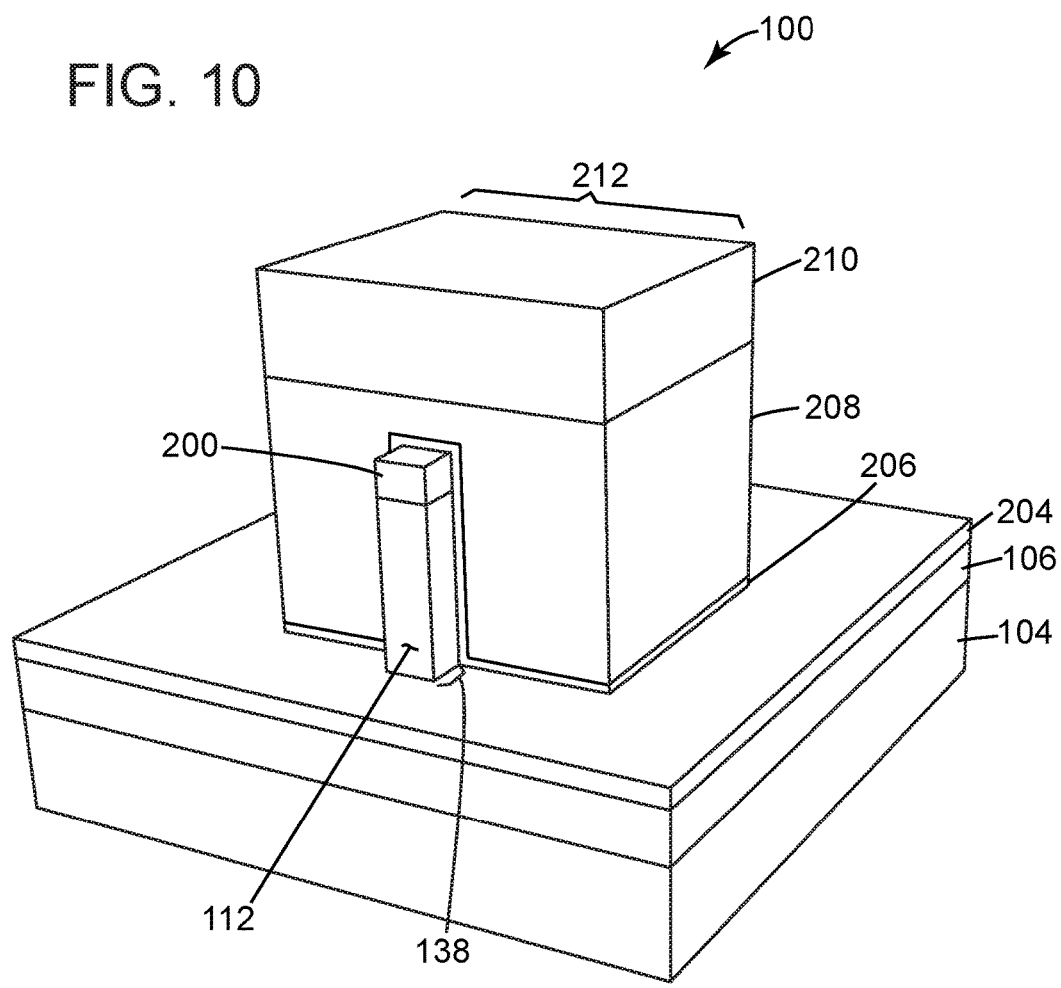
FIG. 10 is a perspective view of an exemplary embodiment of the structure of FIG. 9 having a gate mask disposed on the gate metal layer and having the gate metal layer anisotropically etched in accordance with the present invention.

Referring to FIG. 10, next a lithographic stack 210 is disposed over the structure 100. The lithographic stack 210 can be composed of several different kinds of layers, depending on such parameters as the application requirements, design or proprietary preferences or the like. One such stack of layers includes a stack of four thin films which includes (from top to bottom) a resist layer, a bottom antireflective coating (BARC) layer, a SiON dielectric layer 128 and a spin-on hardmask (SOH) layer.

The lithographic stack 210 is next patterned, through well-known lithographic techniques, to form a gate mask 212 over the fin intermediate portion 142 of the fin 112 and not over the 1$^{st}$ and 2$^{nd}$ fin end portions 138, 140 of the fin 112. Next any portions of the gate metal layer 208 not covered by the gate mask 212 are etched to expose the 1$^{st}$ and 2$^{nd}$ fin end portions 138, 140 of the fin 112 and to leave the gate metal layer 208 disposed over the fin intermediate portion 142 of the fin 112.

Figure 11:
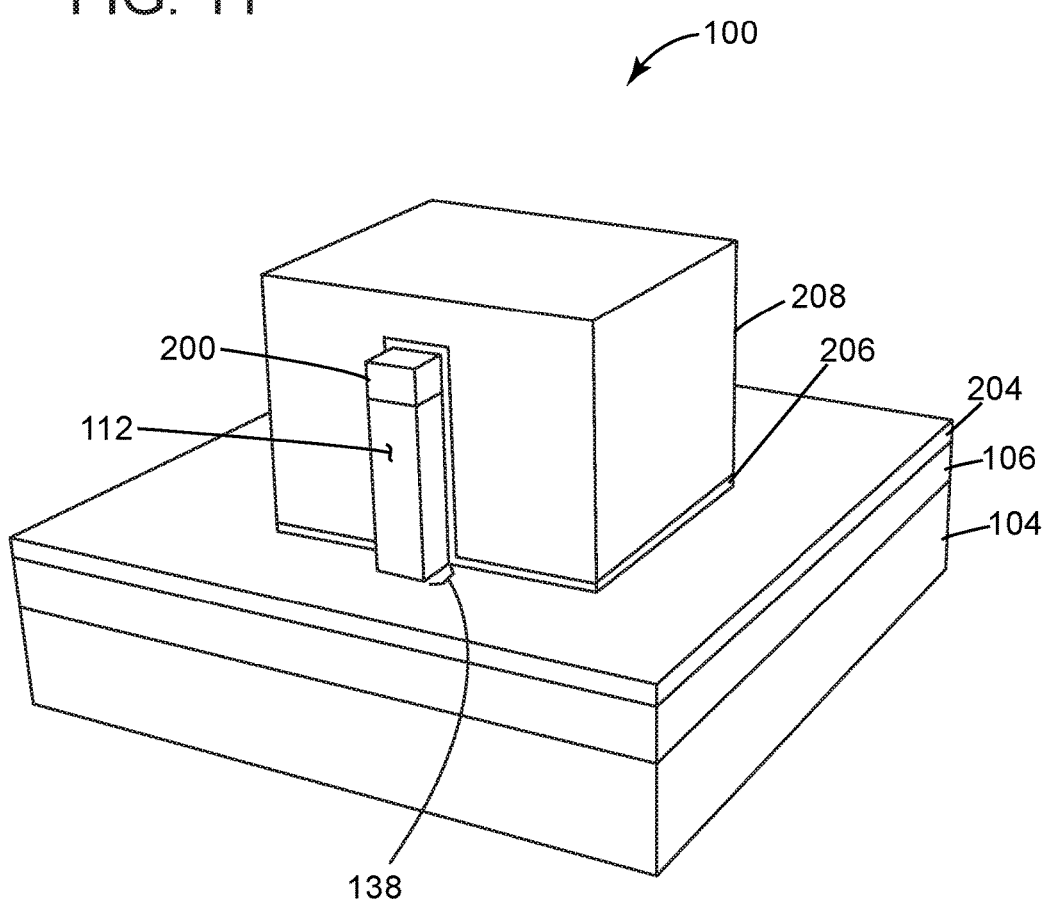
FIG. 11 is a perspective view of an exemplary embodiment of the structure of FIG. 10 having the gate mask removed in accordance with the present invention.

Referring to FIG. 11, next the gate mask 212 is removed. This may be done by a wet etch process or similar.

Referring to FIG. 12, next another FOX layer 214 is disposed over the structure 100 to cover the gate metal layer 208 and the lower spacer layer 204. The FOX layer 214, the gate metal layer 208 and the high-k dielectric layer 206 are then polished down to the level of the hardmask layer 200, which is disposed over the top portion of the fin.

At this stage of the process flow, the gate metal layer has been separated by the fin 112 to form the 1$^{st}$ and 2$^{nd}$ metal gates 114, 116, which are now disposed on opposing sidewalls 114, 116 of the fin 112. The 1$^{st}$ and 2$^{nd}$ metal gates 114, 116 are disposed only on the fin intermediate portion 142 of the fin 112, and not on the 1$^{st}$ end portion 138 or the 2$^{nd}$ end portion 140 of the fin 112. As such, the 1$^{st}$ and 2$^{nd}$ metal gates 114, 116 are now electrically isolated by the fin 112.

Additionally, the high-k dielectric layer 206 has been separated by the fin 112 to form the 1$^{st}$ high-k dielectric 148 and the 2$^{nd}$ high-k dielectric 154. The 1$^{st}$ and 2$^{nd}$ high-k dielectrics are now disposed between the 1$^{st}$ and 2$^{nd}$ metal gates 114, 116 and the fin 112 (best seen in FIG. 2C).

Referring to FIG. 13, the 1$^{st}$ and 2$^{nd}$ metal gates 126, 130 are next recessed below the hardmask layer 200 and below a top portion of the fin 112. This can be done by a reactive ion etch (RIE) process or similar.

Referring to FIG. 14, next the 1$^{st}$ upper spacer 146 is disposed over the 1$^{st}$ metal gate 126 and the 2$^{nd}$ upper spacer 152 is disposed over the 2$^{nd}$ metal gate 130. This can be accomplished by first disposing an upper spacer layer (not shown) over the entire structure 100. The upper spacer layer can then be polished down to the level of the hardmask 200 to form the 1$^{st}$ and 2$^{nd}$ upper spacers 146, 152 disposed over their associated 1$^{st}$ and 2$^{nd}$ metal gates 126, 130. Thereafter, the 1$^{st}$ and 2$^{nd}$ upper spacers 146, 152 can be recessed down (by a RIE process or similar) to a desired level below the top portion of the fin 112.

Referring to FIG. 15, next the hardmask layer 200 is removed from the top portion 118 of the fin 112, to expose the top portion of the fin 118. This can be done by a wet etch process or similar.

Referring to FIG. 16, next the upper S/D region 120 is formed over the top portion 118 of the fin 112. This can be accomplished by a process of epitaxially growing the upper S/D region 120 over the top portion 118 of the fin 112 or other similar process.

Once the upper S/D region 120 is formed, the FOX layer 214 can be removed to provide the structure 100 shown in FIGS. 2A, 2B and 2C without the 1$^{st}$ CB contact 156, the 2$^{nd}$ CB contact 158, the 1$^{st}$ TS contact 160 or the 2$^{nd}$ TS contact 162. However, those CB contacts 156, 158 and TS contacts 160, 162 may be added later in the process flow by well-known methods.

The dual gate vertical FinFET 102 of structure 100 (best seen in FIGS. 2A, 2B and 2C) advantageously has at least two operating speeds by virtue of its two independent gate structures 124, 128. Additionally, the vertical FinFET 102 has a smaller footprint along the X and Y directions (i.e., the substrate plane) than non-vertical FinFETs.

Referring to FIG. 17, because the gate structures 124 and 128 do not cover the 1$^{st}$ and 2$^{nd}$ end portions 138, 140 of fin 112, those end portions 138, 140 may have a disproportionally larger leakage current then the fin intermediate portion 142 of the fin 112. To help prevent such a disproportionally large leakage current, the 1$^{st}$ and 2$^{nd}$ end portions 138, 140 may be subjected to an implantation process 216 earlier in the process flow to change the concentration of dopant level of the 1$^{st}$ and 2$^{nd}$ end portions 138, 140 relative to the concentration of dopant levels of the fin intermediate portion 142.

By way of example, FIG. 17 shows the structure 100 at a stage equivalent to that of FIG. 10, wherein the gate mask 212 is still disposed over the structure 100. At this stage, only the 1$^{st}$ and 2$^{nd}$ end portions 138, 140 are exposed and the fin intermediate portion 142 is protected by the gate metal layer 208. The ion implantation process 216 can then be carried out on the 1$^{st}$ and 2$^{nd}$ end portions 138, 140 leaving the fin intermediate portion 142 largely unaffected.

If the fin intermediate portion 142 is doped primarily with a concentration of n-type dopants, then the 1$^{st}$ and 2$^{nd}$ end portions can be doped with a higher concentration of n-type dopants during the ion implantation process 216. If the fin intermediate portion 142 is doped primarily with a concentration of p-type dopants, than the 1$^{st}$ and 2$^{nd}$ end portions can be doped with a higher concentration of p-type dopants during the ion implantation process 216.

In other words, one of an n-type dopant and a p-type dopant may be implanted during the ion implantation process 216 in the 1$^{st}$ and 2$^{nd}$ fin end portions 138, 140 of the fin 112, such that the 1$^{st}$ and 2$^{nd}$ fin end portions 138, 140 have a higher concentration of the one of the n-type dopant and the p-type dopant than the fin intermediate portion 142 of the fin 140. The result is that the 1$^{st}$ and 2$^{nd}$ fin end portions 138, 140 of the fin 112 will have a higher concentration of one of a p-type dopant and an n-type dopant than the fin intermediate portion 142 of the fin 112.

Referring to FIG. 18, an alternative method of helping to prevent such disproportionately larger leakage current would be to form the 1$^{st}$ and 2$^{nd}$ fin end portions 138, 140 such that the 1$^{st}$ and 2$^{nd}$ fin end portions 138, 140 of the fin 112 are composed of a dielectric material. One such way of accomplishing this would be to subject the 1$^{st}$ and 2$^{nd}$ end portions 138, 140 to a thermal oxidation process 218 earlier in the process flow.

By way of example, FIG. 18 shows the structure 100 at a stage equivalent to that of FIG. 10, wherein the gate mask 212 is still disposed over the structure 100. At this stage, only the 1$^{st}$ and 2$^{nd}$ end portions 138, 140 are exposed and the fin intermediate portion 142 is protected by the gate metal layer 208. The thermal oxidation process 218 can then be carried out on the 1$^{st}$ and 2$^{nd}$ end portions 138, 140 leaving the fin intermediate portion 142 largely unaffected.

The 1$^{st}$ and 2$^{nd}$ fin end portions 138, 140 of the fin 112 may be thermally oxidized such that the 1$^{st}$ and 2$^{nd}$ fin end portions 138, 140 of the fin 112 become composed primarily of a silicon dioxide. Since the silicon dioxide is a dielectric material, the leakage current though the 1$^{st}$ and 2$^{nd}$ end portions 138, 140 will be reduced.

Referring to FIG. 19, the resulting structure 100 with the dual gate vertical FinFET 102 after either the ion implantation process 216 or thermal oxidation process 218 is illustrated. The fin 112 may have 1$^{st}$ and 2$^{nd}$ fin end portions 138, 140 that have a higher concentration of an n-type or a p-type dopant than the fin intermediate portion 142 due to the ion implantation process 216. Alternatively, the fin 112 may have 1$^{st}$ and 2$^{nd}$ fin end portions 138, 140 that are composed of a dielectric material such as silicone dioxide due to the thermal oxidation process 218. In either case the leakage current of the end portions 138, 140 will be reduced.

The FinFET 102 will also advantageously have at least a dual mode of operation wherein in one mode, the current and operating speed will be larger and faster than in the other mode. This is due to the independent operation of the two gate structures 124, 128 that are electrically isolated by the fin 112.

Additionally, the footprint of the vertical FinFET 102 in the X direction and Y direction (the substrate plane) will be smaller than non-vertical FinFETs. This is because the bottom S/D region 110, the fin 112 and the upper S/D region 120 are stacked vertically (in the Z direction) on top of each other respectively.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
   a substrate;
   a vertical FinFET disposed over the substrate, the vertical FinFET including:
   a bottom source/drain (S/D) region disposed over the substrate,
   a fin extending vertically upwards from the bottom S/D region, the fin having a first (1$^{st}$) sidewall, a second (2$^{nd}$) sidewall and a top portion,
   an upper S/D region disposed over the top portion of the fin, the fin defining a channel between the bottom S/D region and the upper S/D region,
   a 1$^{st}$ gate structure having a 1$^{st}$ metal gate, the 1$^{st}$ gate structure disposed on the 1$^{st}$ sidewall of the fin, and
   a 2$^{nd}$ gate structure having a 2$^{nd}$ metal gate, the 2$^{nd}$ gate structure disposed on the 2$^{nd}$ sidewall of the fin; and
   wherein the 1$^{st}$ and 2$^{nd}$ metal gates are electrically isolated from each other by the fin.

2. The semiconductor structure of claim 1 comprising:
the $1^{st}$ gate structure operable to modulate the conduction of charged carriers through the channel;
the $2^{nd}$ gate structure operable to modulate the conduction of charged carriers through the channel; and
wherein the $1^{st}$ and $2^{nd}$ gate structures are operable independently of each other.

3. The semiconductor structure of claim 1 comprising;
the fin extending vertically upwards from the bottom S/D region to the upper S/D region to define an upper fin height;
wherein the upper fin height is greater than or equal to an upper height of either the $1^{st}$ and $2^{nd}$ gate structures.

4. The semiconductor structure of claim 1 comprising:
the fin extending longitudinally along an upper surface of the bottom S/D region to define a $1^{st}$ fin end portion and a $2^{nd}$ fin end portion with a fin intermediate portion extending there between;
wherein the $1^{st}$ and $2^{nd}$ metal gates are disposed within the fin intermediate portion of the fin only.

5. The semiconductor structure of claim 1 wherein the upper S/D region is epitaxially grown.

6. The semiconductor structure of claim 1 comprising:
a $1^{st}$ CB contact in electrical contact with the $1^{st}$ metal gate, the $1^{st}$ CB contact operable to activate the $1^{st}$ metal gate; and
a $2^{nd}$ CB contact in electrical contact with the $2^{nd}$ metal gate, the $2^{nd}$ CB contact operable to activate the $2^{nd}$ metal gate;
wherein the $1^{st}$ and $2^{nd}$ CB contacts are operable to activate their associated $1^{st}$ and $2^{nd}$ metal gates independently of each other.

7. The semiconductor structure of claim 1 wherein the $1^{st}$ gate structure comprises:
a $1^{st}$ lower spacer disposed over the bottom S/D region,
the $1^{st}$ metal gate disposed over the $1^{st}$ lower spacer,
a $1^{st}$ upper spacer disposed over the $1^{st}$ metal gate, and
a $1^{st}$ high-k dielectric disposed between the $1^{st}$ metal gate and the fin.

8. The semiconductor structure of claim 1 wherein the $2^{nd}$ gate structure comprises:
a $2^{nd}$ lower spacer disposed over the bottom S/D region,
the $2^{nd}$ metal gate disposed over the $2^{nd}$ lower spacer,
a $2^{nd}$ upper spacer disposed over the $2^{nd}$ metal gate, and
a $2^{nd}$ high-k dielectric disposed between the $2^{nd}$ metal gate and the fin.

9. The semiconductor structure of claim 4 wherein the $1^{st}$ and $2^{nd}$ fin end portions of the fin have a higher concentration of one of a p-type dopant and an n-type dopant than the fin intermediate portion of the fin.

10. The semiconductor structure of claim 4 wherein the $1^{st}$ and $2^{nd}$ fin end portions of the fin are composed of a dielectric material.

11. The semiconductor structure of claim 10 wherein the $1^{st}$ and $2^{nd}$ fin end portions of the fin are composed of a silicon dioxide.

* * * * *